(12) United States Patent
Takano (10) Patent No.: US 7,491,662 B2
(45) Date of Patent: Feb. 17, 2009

(54) SUBSTRATE PROCESSING APPARATUS

(75) Inventor: Satoshi Takano, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/590,521

(22) PCT Filed: May 12, 2005

(86) PCT No.: PCT/JP2005/009107

§ 371 (c)(1),
(2), (4) Date: Aug. 24, 2006

(87) PCT Pub. No.: WO2005/112108

PCT Pub. Date: Nov. 24, 2005

(65) Prior Publication Data

US 2007/0184636 A1      Aug. 9, 2007

(30) Foreign Application Priority Data

May 17, 2004   (JP)  .............................. 2004-146113

(51) Int. Cl.
*H01L 21/00* (2006.01)
(52) U.S. Cl. ..................... 438/800; 414/939; 414/940; 257/E21.001
(58) Field of Classification Search .............. 438/800, 438/30; 414/935, 939, 940
See application file for complete search history.

(56) References Cited

U.S. PATENT DOCUMENTS

2004/0005149 A1* 1/2004 Sugimoto et al. ........... 396/564

FOREIGN PATENT DOCUMENTS

| EP | 0 272 141 | * | 6/1988 |
| JP | 2004-15021 | | 1/2004 |

OTHER PUBLICATIONS

South Korean Patent Office "Notification of Reason for Refusal", dated Aug. 22, 2007.
Chinese Patent Office "Notification of Reason for Refusal", dated Sep. 21, 2007.
Chinese Patent Office "Notification of Reason for Refusal", dated Mar. 14, 2008.

* cited by examiner

*Primary Examiner*—Alexander G Ghyka
(74) *Attorney, Agent, or Firm*—Wenderoth, Lind & Ponack, L.L.P.

(57) ABSTRACT

Substrate processing with return processing is carried out efficiently by a substrate processing apparatus that continuously processes a plurality of substrates. The apparatus is equipped with a conveyor chamber constituting a substrate convey space, a plurality of process chambers in which substrate processing is carried out, a substrate conveying device provided in the conveyor chamber having a function of conveying substrates, and a substrate convey control device that controls the process of substrate conveyance by the substrate conveying device so that in a case in which after a substrate is continuously processed by two or more process chambers, the substrate is re-conveyed from the last process chamber to any of the two or more process chambers other than the last and return processing is implemented. In the re-conveyance, the substrate is conveyed to any of the process chambers after being temporarily retracted to a place other than a process chamber.

12 Claims, 8 Drawing Sheets

(A) When the number of continuous processes is two
Cycle time when the number of continuous processes is two : $CT1'=(3)/2=(4P+8T)/2$ (B) When the number of continuous processes is three
Cycle time when the number of continuous processes is three : $CT2'=(4)/3=(6P+12T)/3$ (C) When the number of continuous processes is four
Cycle time when the number of continuous processes is four : $CT3'=(5)/4=(8P+16T)/4$

Fig.3

(A) In processes P1, P2, P3, when only implementing P2, P3 return processing (B) When return processing is implemented twice (return processing is implemented twice in the example (A))

(C) When process times are different

SUBSTRATE PROCESSING APPARATUS

BACKGROUND OF THE INVENTION

1. Technical Field

The present invention relates to a substrate processing apparatus and the like; it particularly relates to a substrate processing apparatus and the like that when continuously processing a plurality of substrates, efficiently carries out substrate processing with return processing.

2. Description of Related Art

Substrate processing apparatuses such as for example semiconductor manufacturing apparatuses that perform prescribed processing of semiconductor substrates (wafers) and LCD (Liquid Crystal Display) manufacturing apparatuses that perform prescribed processing of glass substrates for LCDs, are provided with a plurality of process chambers, in each of the process chambers a substrate process such as film formation is carried out. Also, transfer machines are used to convey substrates between process chambers.

Also, for example, in a plurality of process chambers capable of different processes, while it is standard procedure to form laminated films in a first process pass of each, there is also a desire for a process for forming laminated films that amount to, or more than, the number of process chambers, using two or more process chambers (return processing). Specifically, with return processing, a substrate that has passed through another process chamber is conveyed to a process chamber in which processing of the substrate has been completed, and is again subjected to the same processing or to processing under different conditions.

The following documents disclose related apparatuses:

Unexamined Patent Application Publication No. Hei 11-102953; and

Unexamined Patent Application Publication No. Hei 10-199960.

SUMMARY OF THE INVENTION

However, in the case of a conventional substrate processing apparatus or the like, the cycle time becomes large when carrying out process substrate processing with return processing in a case in which a plurality of substrates are processed continuously, and the standby time (interval) when neither process-chamber process processing or convey process is carried out becomes large, giving rise to the problem of a pronounced reduction in the processing efficiency of each process chamber, resulting in a drop in the semiconductor substrate production efficiency.

In view of this conventional situation, the object of the present invention is to provide a substrate processing apparatus and the like that when continuously processing a plurality of substrates, can efficiently carry out substrate processing with return processing.

To attain the above object, the substrate processing apparatus according to the present invention continuously processes a plurality of substrates, as follows.

That is, in a configuration equipped with a conveyor chamber constituting a substrate convey space, a plurality of process chambers in which substrate processing is carried out, and substrate convey means provided in the conveyor chamber having a function of conveying substrates, a substrate convey control means controls the process of substrate convey by the substrate convey means so that, in a case in which after a substrate is continuously processed by two or more process chambers, the substrate is re-conveyed from the last process chamber to any of the two or more process chambers other than the last and return processing implemented, in the re-conveyance the substrate is conveyed to said any of the process chambers after being temporarily retracted to a place other than a process chamber.

Therefore, when continuously processing a plurality of substrates, substrate processing with return processing can be efficiently carried out; specifically, for example, it is possible to reduce cycle times and to reduce process chamber standby times (intervals), while preventing deadlock between the plurality of substrates being continuously processed.

Here, various numbers may be used as the number of the plurality of process chambers with which the substrate processing apparatus is equipped.

Also, various numbers may be used as the number of the two or more process chambers that carry out substrate processing.

Also, various chambers may be used as the two or more process chambers that carry out substrate processing.

Also, various numbers may be used as the number n of process chambers (number of continuous processes) subject to return processing.

Also, various procedures may be used as the substrate processing procedure in the return processing and as the overall substrate processing procedure. That is, various orders may be used as the order in which a substrate is processed in the process chambers.

Also, various time intervals may be used as the time interval at which a continuous plurality of substrates are loaded for substrate processing (loading interval) when continuously processing a plurality of substrates; for example, a time interval may be used that enables deadlock to be prevented.

Also, as the substrates there may be used, for example, silicon wafers or glass substrates for manufacturing semiconductor apparatuses and LCD apparatuses.

Also, various times may be used as the time a substrate is temporarily retracted (retraction time) to a place other than a process chamber; for example, a time may be used that enables deadlock to be prevented.

Also, various places may be used as the place to which a substrate is temporarily retracted; as one example, one, or two or more preliminary chambers may be provided to be used as a place other than a process chamber, and as another example, one, or two or more load-lock chambers may be used as a place other than a process chamber.

The substrate processing apparatus according to the present invention was configured as follows.

That is, in a case in which the substrate process time (process processing time) in each of said two or more process chambers is equal, taking n as the number of process chambers (number of continuous processes) subject to return processing and T as substrate convey time between processing chambers, the retraction time used by the substrate convey control means is $\{(n-1) \cdot T\}$.

Moreover, T is also taken as the substrate convey time from load-lock chamber to process chamber or the substrate convey time from process chamber to load-lock chamber, as in the case of the substrate convey time from one process chamber to another process chamber.

Therefore, substrate processing with return processing can be efficiently carried out in cases in which the substrate process times in each of said two or more process chambers are the same.

The substrate processing apparatus according to the present invention was configured as follows.

That is, in a case in which the substrate process time (process processing time) in any of said two or more process chambers is different, taking n as the number of process chambers (number of continuous processes) subject to return processing, T as substrate convey time between processing chambers and Pmax as the maximum substrate process time among said two or more process chambers, the retraction time used by the substrate convey control means is the result of adding the difference between Pmax and the substrate process times in each of the process chambers in which return processing is implemented to $\{(n-1)\cdot T\}$ in respect of all of said process chambers.

Moreover, T is also taken as the substrate convey time from load-lock chamber to process chamber or the substrate convey time from process chamber to load-lock chamber, as in the case of the substrate convey time from one process chamber to another process chamber.

Therefore, substrate processing with return processing can be efficiently carried out in cases in which the substrate process times in any of said two or more process chambers are different.

The semiconductor device manufacturing method according to the present invention is used to manufacture semiconductor devices by continuously processing a plurality of substrates, as follows.

That is, in a case in which after a substrate is continuously processed by two or more process chambers, the substrate is re-conveyed from the last process chamber to any of the two or more process chambers other than the last and return processing implemented, in the re-conveyance the substrate is conveyed to said any of the process chambers after being temporarily retracted to a place other than a process chamber.

Therefore, substrate processing with return processing can be efficiently carried out when manufacturing semiconductor devices by continuously processing a plurality of substrates.

Various devices may be used as the semiconductor device.

BRIEF DESCRIPTION OF THE DRAWINGS

FIGS. 2(A), (B), (C) are drawings showing examples of time charts of the processing of a plurality of substrates.

FIGS. 3(A), (B), (C) are drawings showing examples of time charts of the processing of a plurality of substrates.

FIGS. 8(A), (B), (C) are drawings showing examples of time charts in the case of the processing of a plurality of substrates.

DETAILED DESCRIPTION OF THE INVENTION

An embodiment of the present invention will now be described with reference to the drawings.

This embodiment is explained with respect to the examples of a substrate processing apparatus that processes semiconductor substrates and a semiconductor apparatus manufacturing method, but the same kind of configuration and operation can be applied to, for example, substrate processing apparatuses and the like that process LCD substrates.

Figure 1:
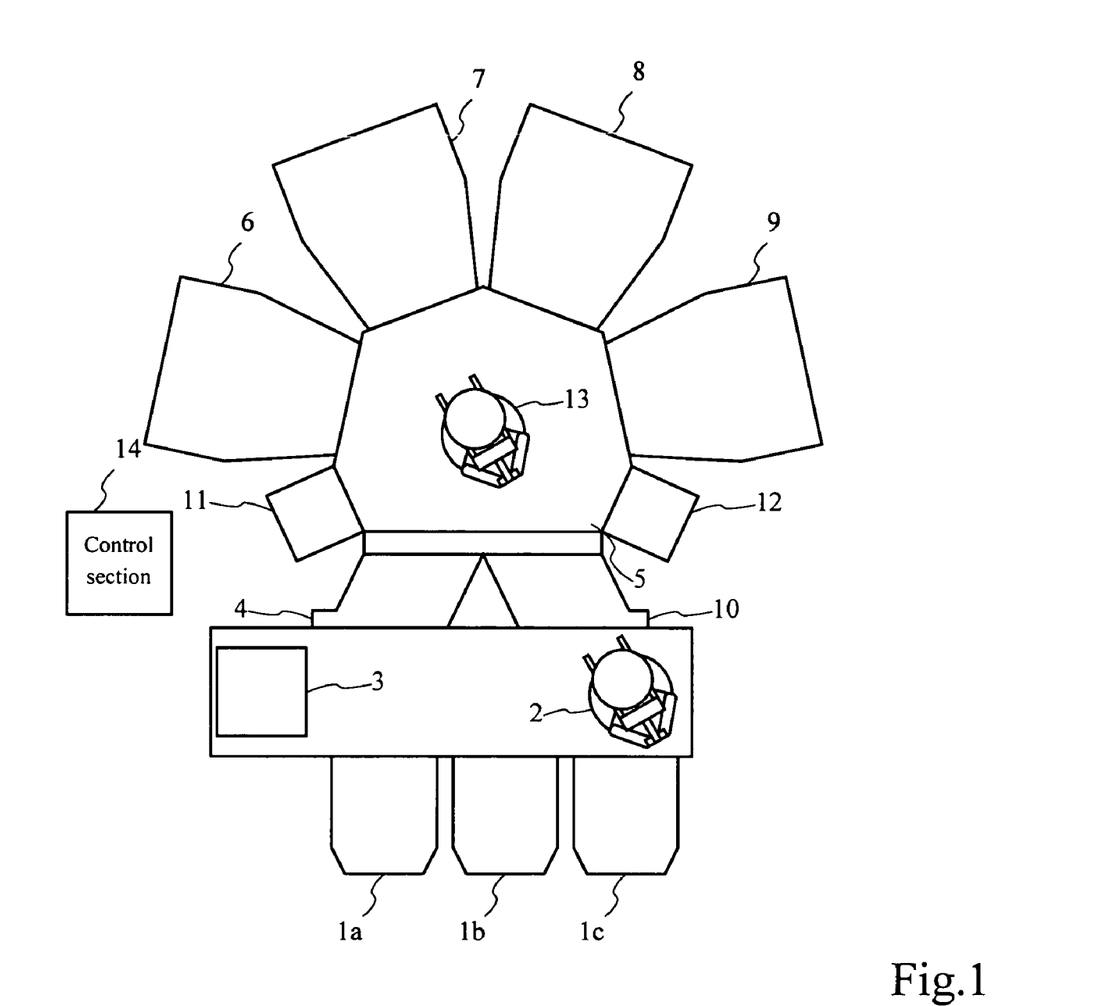
FIG. 1 is a drawing of an example of a configuration of the substrate processing apparatus according to an embodiment of the present invention.

FIG. 1 shows an example of a configuration of the substrate processing apparatus according to an embodiment of the present invention.

The substrate processing apparatus of this example comprises carrier stations (load ports: LP) 1a, 1b, 1c, a transfer machine (LH) 2 for air-atmosphere use, a substrate alignment unit (aligner: AU) 3, a first load-lock chamber (LM1) 4, a conveyor chamber 5 provided with a transfer machine (TH) 13 for vacuum-atmosphere use, a first process chamber (PM1) 6, a second process chamber (PM2) 7, a third process chamber (PM3) 8, a fourth process chamber (PM4) 9, a second load-lock chamber (LM2) 10, a first preliminary chamber 11, a second preliminary chamber 12, and a control section 14.

Components here comprise two or more (four, in this example) of process chambers 6~9 that perform prescribed processing of substrates adjoining the periphery of a centrally disposed conveyor chamber 5 equipped with a transfer machine 13 that conveys substrates, and for substrate exchanges between the conveyor chamber 5 and the outside, load-lock chambers 4, 10 for replacing the atmosphere with an inert gas such as N2 and preventing air components from entering the process chambers 6~9. There are also carrier stations 1a, 1b, 1c for temporarily setting carriers holding substrates during processing, a transfer machine 2 for conveying single substrates at any time from a carrier above the carrier stations 1a, 1b, 1c to the load-lock chambers 4, 10, and a substrate alignment unit 3 for precisely positioning substrates in the carrier in the load-lock chambers 4, 10. The conveyor chamber 5 is also provided with preliminary chambers 11, 12 that enable temporary retraction of substrates. There is also a control section 14.

In this example the preliminary chambers 11, 12 are designed to permit retraction of the total number of substrates that can be processed at one time by all of the process chambers 6~9. In the example of this configuration, for example, the process chambers 6~9 can each process one substrate, so the process chambers 6~9 can process a total of four substrates, so the two preliminary chambers 11, 12 are constructed to each enable retraction of two substrates, enabling all of the preliminary chambers 11, 12 to retract a total of four substrates.

This example shows one in which two preliminary chambers 11, 12 are provided. However, the number of preliminary chambers may be arbitrary. For example, a configuration may be employed in which just one preliminary chamber is used for substrate retraction, or a configuration may be used in which two or more preliminary chambers are employed simultaneously for substrate retraction.

Also, the process chambers 6~9 are each configured as, for example, a film formation chamber, or buffer chamber or the like.

Also, in this example the control section 14 is configured to execute a prescribed program using hardware resources such as ROM (Read Only Memory), RAM (Random Access Memory), and CPU (Central Processing Unit).

In this embodiment, the time required for the processing of the processes of the process chambers 6~9 is defined by the time from the closing of the valve mechanism (gate valve: GV) separating the process chambers 6~9 and the conveyor chamber 5 until the opening of the GV after the processing has been carried out.

In this embodiment, also, the time required for a substrate to be conveyed by the vacuum-atmosphere-use transfer machine 13 from the process chambers 6~9 or load-lock chambers 4, 10 that is the transfer origin to the process chambers 6~9 or load-lock chambers 4, 10 that is the transfer destination, is defined by the time required to convey the substrate from the process chamber or the like X that is the transfer origin to another process chamber or the like Y that is the transfer destination.

In this embodiment, also, the number of process chambers that carry out return processing is the number of continuous processes (n). That is, the number of continuous processes n is the number of process chambers that are subject to return processing. The number of return processing passes is m.

Figure 5:
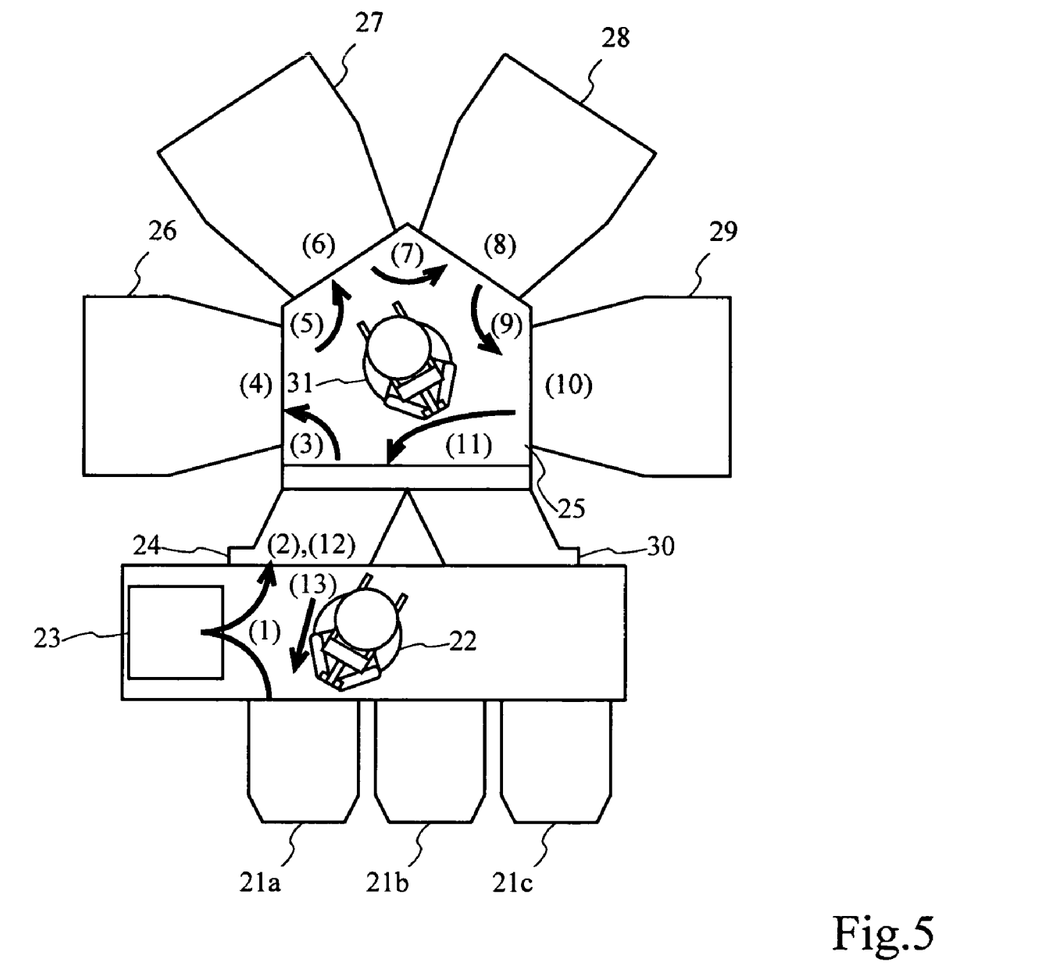
FIG. 5 is a drawing showing an example of a substrate convey flow.
Figure 6:
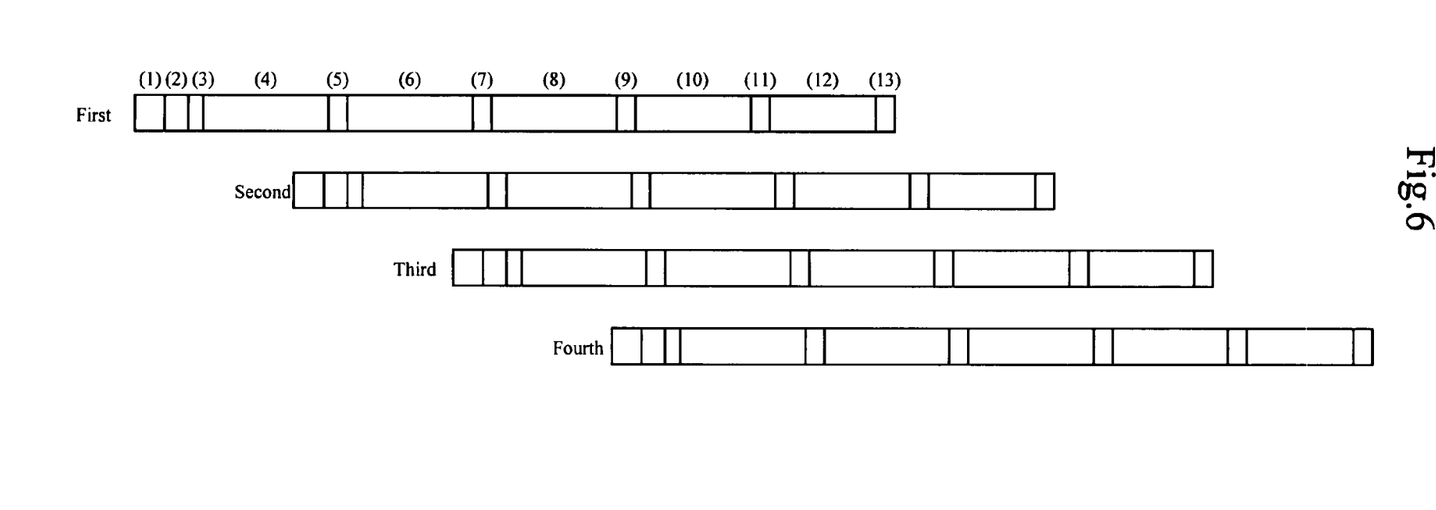
FIG. 6 is a drawing showing an example of a substrate processing history as an event time chart.

In this embodiment, also, the event time chart only shows the portion of the vacuum convey system relating to return processing (for example, the processing portion corresponding to (3)~(11) shown in FIGS. 5 and 6).

FIGS. 2(A), (B), (C) show examples of time charts of the processing of a plurality of substrates by the substrate processing apparatus shown in FIG. 1, in the case of substrate processing with return processing.

In this example, the process time of each of the process chambers 6~9 is the same time P, and the convey time for one pass by the vacuum-atmosphere-use transfer machine 13 is T.

Also, this example shows a case in which the number of return processing passes m is one.

The point that characterizes this example is that a substrate is briefly passed through the preliminary chambers 11, 12 prior to being again conveyed to the same process chambers 6~9. For example, when a substrate is conveyed in the order first process chamber 6 (first time), second process chamber 7 (first time), first process chamber 6 (second time), second process chamber 7 (second time), before the substrate is conveyed the second time to the first process chamber 6, it is conveyed briefly via the first preliminary chamber 11 or second preliminary chamber 12. That is, it is the point that the substrate is conveyed in the order first process chamber 6 (first time), second process chamber 7 (first time), preliminary chamber (first preliminary chamber 11 or second preliminary chamber 12), first process chamber 6 (second time), second process chamber 7 (second time).

FIG. 2(A) shows a case in which the number of continuous processes is two.

In this case, with respect to each of first, second, third, . . . , substrates, there are carried out a convey process from a load-lock chamber (first load-lock chamber 4 or second load-lock chamber 10) to the first process chamber 6, process processing P1 at the first process chamber 6, a convey process from the first process chamber 6 to the second process chamber 7, process processing P2 at the second process chamber 7, a convey process from the second process chamber 7 to a preliminary chamber (first preliminary chamber 11 or second preliminary chamber 12), retraction at said preliminary chamber (retraction time W), a convey process from said preliminary chamber to the first process chamber 6, process processing P1 at the first process chamber 6, a convey process from the first process chamber 6 to the second process chamber 7, process processing P2 at the second process chamber 7, a convey process from the second process chamber 7 to a load-lock chamber (first load-lock chamber 4 or second load-lock chamber 10). Each convey process is carried out by the vacuum-atmosphere-use transfer machine 13 of the conveyor chamber 5.

Also, the retraction time W of the substrate retracted to the preliminary chambers 11, 12 is set to be a time equal to one convey time T (that is, W=T).

Also, the loading of the second substrate is timed to be after the completion of the first processing of the first substrate at the first process chamber 6, a timing at which there is no overlap with the convey of the first substrate; specifically, it is set to be (second substrate loading interval=P+2T).

Also, the loading of the third substrate is timed to be after the completion of the first processing of the second substrate at the first process chamber 6, a timing at which there is no overlap with the convey of the second substrate; specifically, it is set to be (third substrate loading interval=3P+5T+W=3P+6T).

Thus, (loading interval of first substrate and third substrate=4P+8T).

FIG. 2(B) shows a case in which the number of continuous processes is three.

In this case, with respect to each of first, second, third, . . . , substrates, there are carried out a convey process from a load-lock chamber (first load-lock chamber 4 or second load-lock chamber 10) to the first process chamber 6, process processing P1 at the first process chamber 6, a convey process from the first process chamber 6 to the second process chamber 7, process processing P2 at the second process chamber 7, a convey process from the second process chamber 7 to third process chamber 8, process processing P3 at the third process chamber 8, a convey process from the third process chamber 8 to a preliminary chamber (first preliminary chamber 11 or second preliminary chamber 12), retraction at said preliminary chamber (retraction time W), a convey process from said preliminary chamber to the first process chamber 6, process processing P1 at the first process chamber 6, a convey process from the first process chamber 6 to the second process chamber 7, process processing P2 at the second process chamber 7, a convey process from the second process chamber 7 to the third process chamber 8, process processing P3 at the third process chamber 8, a convey process from the third process chamber 8 to a load-lock chamber (first load-lock chamber 4 or second load-lock chamber 10). Each convey process is carried out by the vacuum-atmosphere-use transfer machine 13 of the conveyor chamber 5.

Also, the retraction time W of the substrate retracted to the preliminary chambers 11, 12 is set to be a time equal to two convey times 2T (that is, W=2T).

Also, the loading of the second substrate is timed to be after the completion of the first processing of the first substrate at the first process chamber 6, a timing at which there is no overlap with the convey of the first substrate; specifically, it is set to be (second substrate loading interval=P+2T).

In the same way, the loading of the third substrate is timed to be after the completion of the first processing of the second substrate at the first process chamber 6, a timing at which there is no overlap with the convey of the second substrate; specifically, it is set to be (third substrate loading interval=P+2T).

Also, the loading of the fourth substrate is timed to be after the completion of the first processing of the third substrate at the first process chamber 6, a timing at which there is no overlap with the convey of the third substrate; specifically, it is set to be (fourth substrate loading interval=4P+6T+W=4P+8T).

Thus, (loading interval of first substrate and fourth substrate=6P+12T).

FIG. 2(C) shows a case in which the number of continuous processes is four.

In this case, with respect to each of first, second, third, . . . , substrates, there are carried out a convey process from a load-lock chamber (first load-lock chamber 4 or second load-lock chamber 10) to the first process chamber 6, process processing P1 at the first process chamber 6, a convey process from the first process chamber 6 to the second process chamber 7, process processing P2 at the second process chamber 7, a convey process from the second process chamber 7 to third process chamber 8, process processing P3 at the third process chamber 8, a convey process from the third process chamber 8 to fourth process chamber 9, process processing P4, a convey process from the fourth process chamber 9 to a preliminary chamber (first preliminary chamber 111 or second preliminary chamber 12), retraction at said preliminary chamber (retraction time W), a convey process from said preliminary chamber to the first process chamber 6, process processing P1 at the first process chamber 6, a convey process from the first process chamber 6 to the second process chamber 7, process processing P2 at the second process chamber 7, a convey process from the second process chamber 7 to the third process chamber 8, process processing P3 at the third process chamber 8, a convey process from the third process chamber 8 to the fourth process chamber 9, process processing P4 at the fourth process chamber 9, a convey process from the fourth process chamber 9 to a load-lock chamber (first load-lock chamber 4 or second load-lock chamber 10). Each convey process is carried out by the vacuum-atmosphere-use transfer machine 13 of the conveyor chamber 5.

Also, the retraction time W of the substrate retracted to the preliminary chambers 11, 12 is set to be a time equal to three convey times 3T (that is, W=3T).

Also, the loading of the second substrate is timed to be after the completion of the first processing of the first substrate at the first process chamber 6, a timing at which there is no overlap with the convey of the first substrate; specifically, it is set to be (second substrate loading interval=P+2T).

In the same way, the loading of the third substrate is timed to be after the completion of the first processing of the second substrate at the first process chamber 6, a timing at which there is no overlap with the convey of the second substrate; specifically, it is set to be (third substrate loading interval=P+2T).

In the same way, the loading of the fourth substrate is timed to be after the completion of the first processing of the third substrate at the first process chamber 6, a timing at which there is no overlap with the convey of the third substrate; specifically, it is set to be (fourth substrate loading interval=P+2T).

Also, the loading of the fifth substrate is timed to be after the completion of the first processing of the fourth substrate at the first process chamber 6, a timing at which there is no overlap with the convey of the fourth substrate; specifically, it is set to be (fifth substrate loading interval=5P+7T+W=5P+10T).

Thus, (loading interval of first substrate and fifth substrate=8P+16T).

In the substrate processing flow of this example, the loading interval of the second substrate onwards has the characteristic that, when n is the number of continuous processes, with respect to a natural number k, the loading interval of the $(k \cdot n+1)$th substrate is different from the loading interval of other substrates. Moreover, k is used to define the substrate interval that is different from just any substrate loading interval.

Specifically, as shown in FIG. 2(A), when the number n of continuous processes is n=2, the loading interval of the 3, 5, 7, ... th (k=1, 2, 3, ...) substrate differs from the others and, as shown in FIG. 2(B), when the number n of continuous processes is n=3, the loading interval of the 4, 7, 10, ... th (k=1, 2, 3, ...) substrate differs from the others and, as shown in FIG. 2(C), when the number n of continuous processes is n=4, the loading interval of the 5, 9, 13, ... th (k=1, 2, 3, ...) substrate differs from the others.

Here, when the processing time of each process is set at a uniform P and the convey time is set at T, the substrate loading interval is calculated from the following (condition 1), (condition 2).

Also, the brief substrate retraction time W at a preliminary chamber is calculated from the following (3).

(Condition 1) Loading interval of $(k \cdot n+1)$th substrate=$(n+1) \cdot (P+2T)$ (Condition 2) Loading interval of a substrate other than the above=(P+2T)

(Condition 3) W=(n−1)·T

Figure 2:
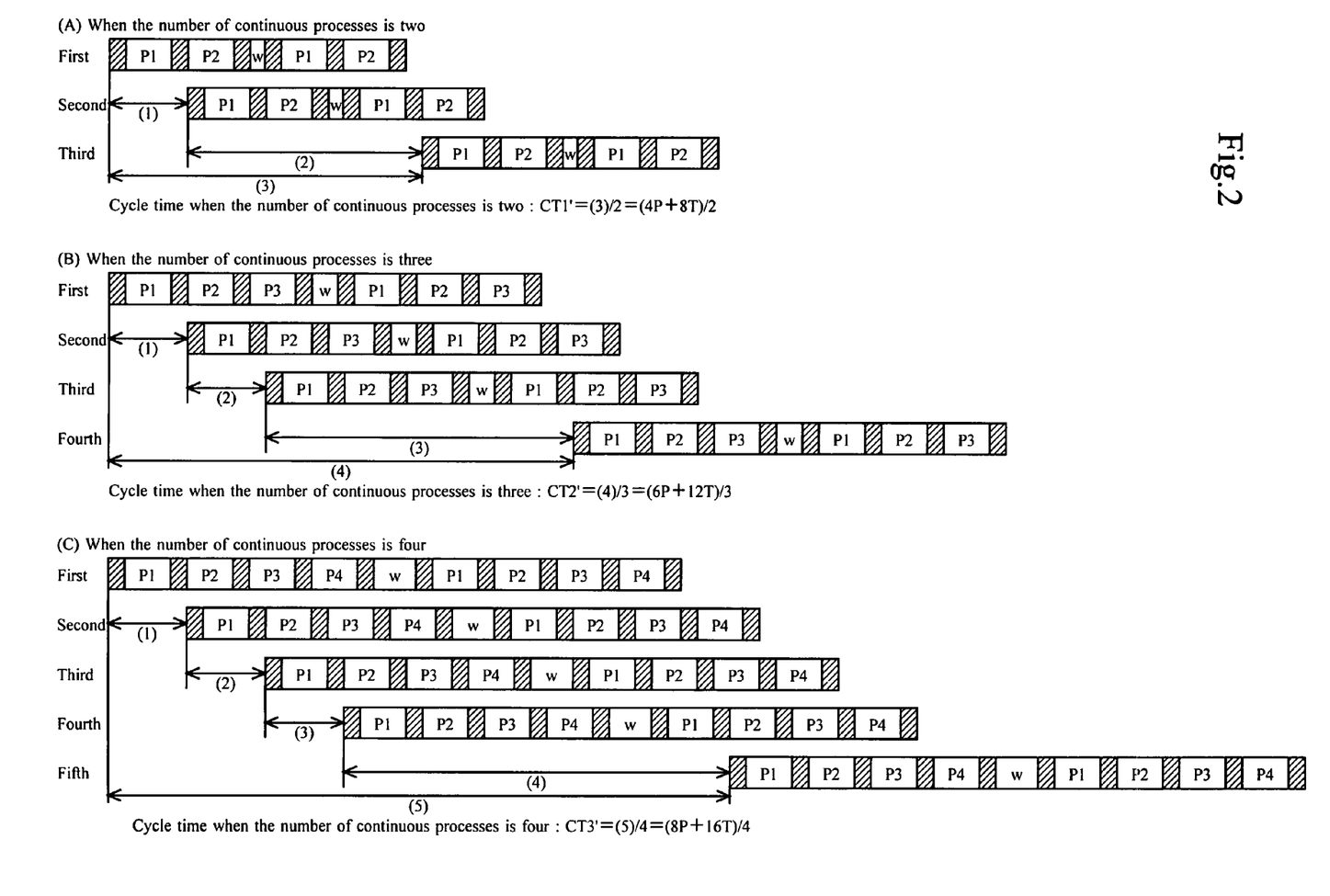

The substrate processing flows shown in FIGS. 2 (A), (B), (C) are realized by satisfying the above (condition 1)~(condition 3).

Also, the reference used for calculating the cycle time in a substrate processing flow such as in this example will now be discussed.

Figure 8:
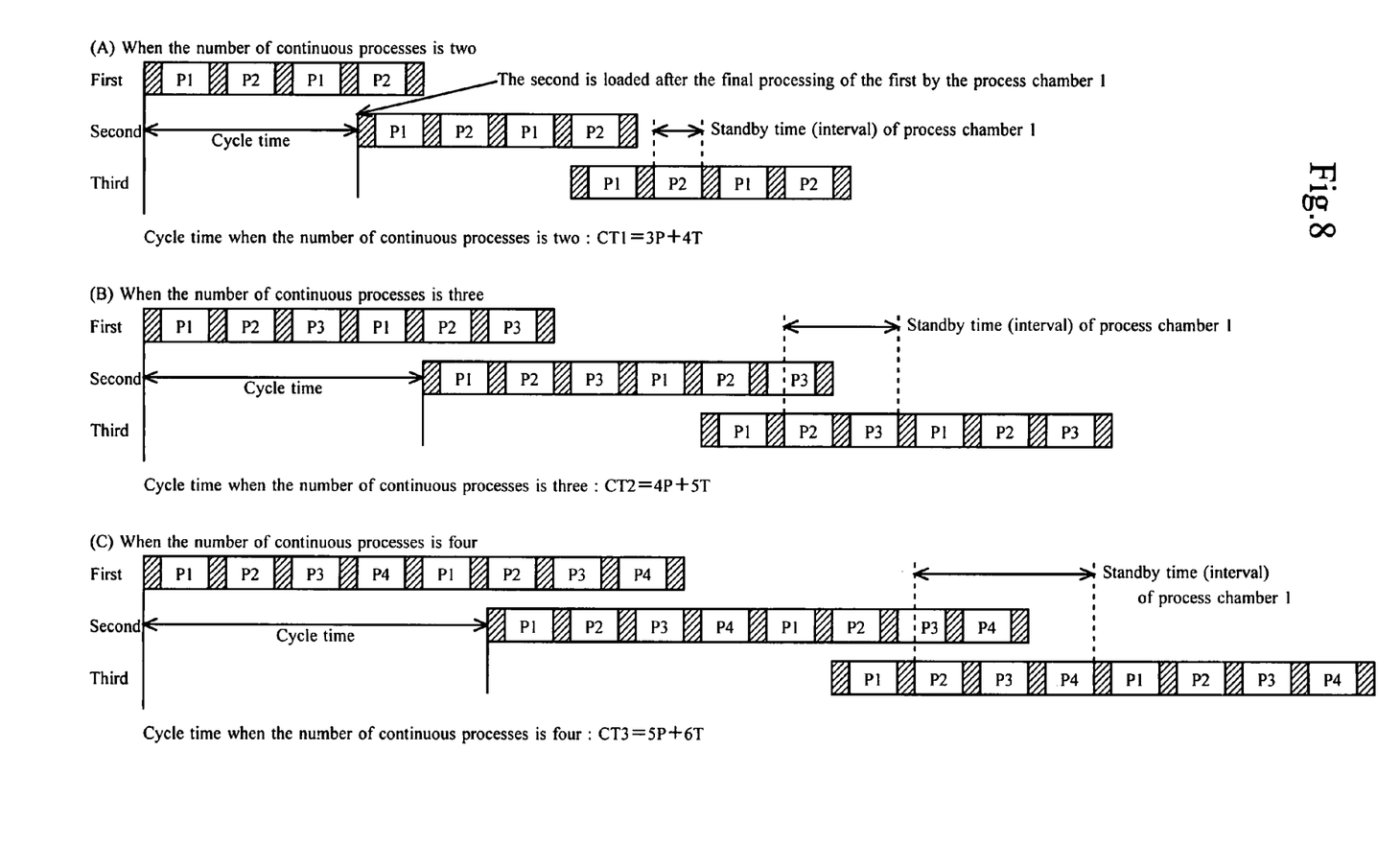

That is, because with the substrate processing flow of this example the substrate loading interval is not fixed, the kind of thinking shown in, for example, FIGS. 8(A), (B), (C) (substrate loading interval=cycle time) is not possible. So, with the substrate processing flow of this example, when n is the number of continuous processes and k is an arbitrary natural number, focussing on the fact that n substrates are processed between when the $\{(k-1) \cdot n+1\}$th substrate is loaded and the $(k \cdot n+1)$th substrate is loaded, the average loading interval per substrate was calculated by dividing this loading interval by n and defined as the cycle time.

Specifically, as shown in FIG. 2(A), the result (2P+4T) of dividing the first and third substrate loading times (4P+8T) resulting from when the number n of continuous processes is two and, for example, k=1 by n (=2), will be cycle time CT1'. Also, as shown in FIG. 2(B), the result (2P+4T) of dividing the first and fourth substrate loading times (6P+12T) resulting from when the number n of continuous processes is three and, for example, k=1 by n (=3), will be cycle time CT2'. Also, as shown in FIG. 2(C), the result (2P+4T) of dividing the first and fifth substrate loading times (8P+16T) resulting from when the number n of continuous processes is four and, for example, k=1 by n (=4), will be cycle time CT3'.

In this way, cycle times CT1', CT2', CT3' when the number n of continuous processes is 2, 3, 4, respectively, become equal (2P+4T), and similarly, the cycle time becomes a fixed value (2P+4T) that does not depend on the number n of continuous processes.

Also, compared to cycle time CT1 (=3P+4T) when the number n of continuous processes is at the shortest n=2 in a method in which the cycle time tends to increase with the increase in the number n of continuous processes, as shown in FIGS. 8(A), (B), (C), the cycle time (2P+4T) of this example reduces the time for one process processing pass, showing that with this example the processing efficiency is improved.

While the above is in the case of return processing being carried out in respect of all process chambers subject to substrate processing, the present invention is not necessarily limited to such a case, and various other processing may be carried out. And, various improvements may be effected by supplementary application with respect to each circumstance, to the extent that it does not depart from the gist of the present invention.

Figure 3:
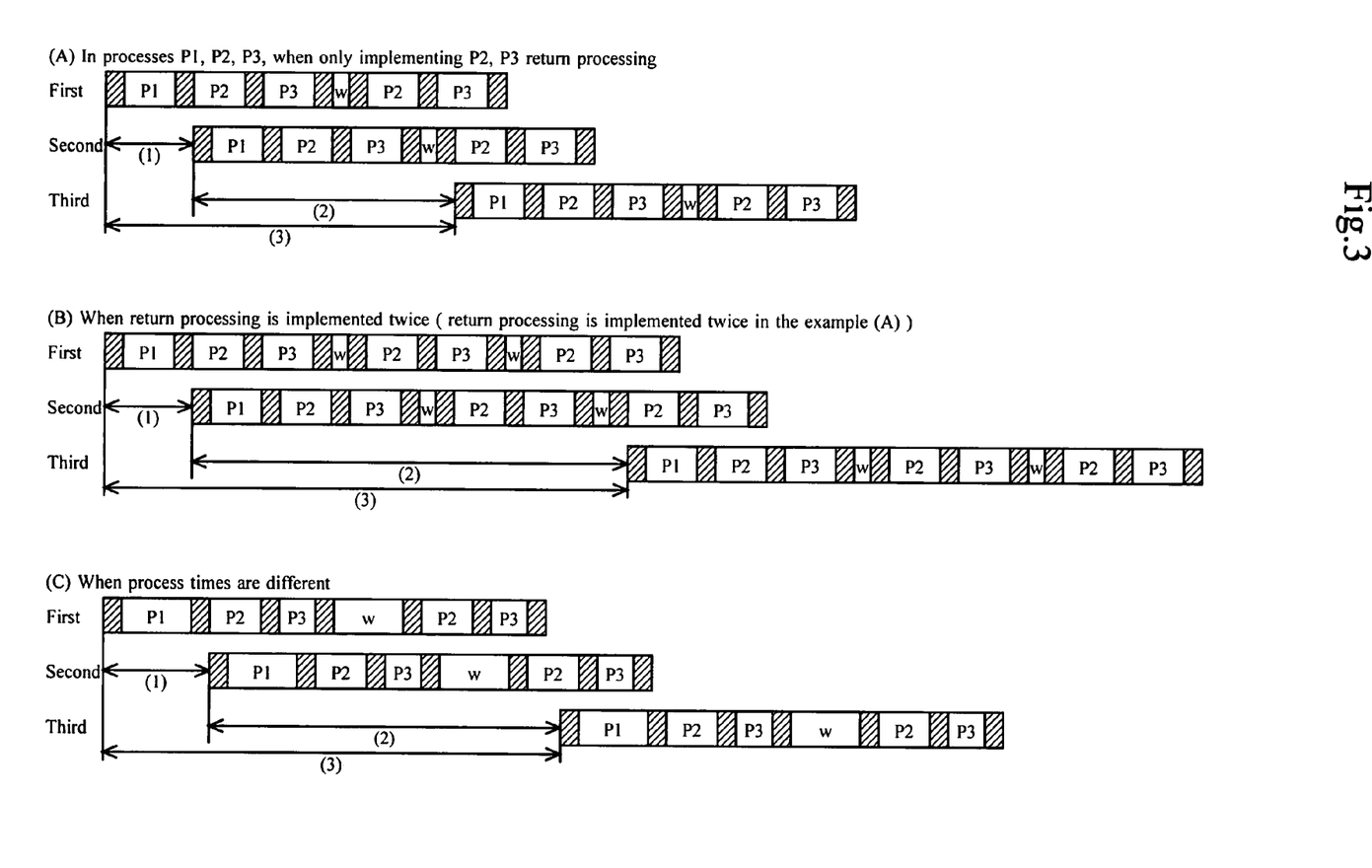

As application examples, FIGS. 3(A), (B), (C) show examples, in substrate processing with return processing, of event time charts in the case of the processing of a plurality of substrates by the substrate processing apparatus shown in FIG. 1.

Points that are not specifically described in respect of FIGS. 3(A), (B), (C) are taken to be the same as those described with respect to FIGS. 2(A), (B), (C).

FIG. 3(A) shows a case in which, when carrying out process processing P1 by the first process chamber 6, process processing P2 by the second process chamber 7, process processing P3 by the third process chamber 8, return processing is implemented in respect of just the process processing P2 by the second process chamber 7 and the process processing P3 by the third process chamber 8. In this case, the number n of continuous processes is defined as two, the subject processes being the two process processings P2, P3 that implement return processing.

In this case, with respect to each of first, second, third, . . . , substrates, there are carried out a convey process from a load-lock chamber (first load-lock chamber 4 or second load-lock chamber 10) to the first process chamber 6, process processing P1 at the first process chamber 6, a convey process from the first process chamber 6 to the second process chamber 7, process processing P2 at the second process chamber 7, a convey process from the second process chamber 7 to third process chamber 8, process processing P3 at the third process chamber 8, a convey process from the third process chamber 8 to a preliminary chamber (first preliminary chamber 11 or second preliminary chamber 12), retraction at said preliminary chamber (retraction time W), a convey process from said preliminary chamber to the second process chamber 7, process processing P2 at the second process chamber 7, a convey process from the second process chamber 7 to the third process chamber 8, process processing P3 at the third process chamber 8, a convey process from the third process chamber 8 to a load-lock chamber (first load-lock chamber 4 or second load-lock chamber 10). Each convey process is carried out by the vacuum-atmosphere-use transfer machine 13 of the conveyor chamber 5.

Also, the retraction time W of the substrate retracted to the preliminary chambers 11, 12 is set to be a time equal to one convey time T (that is, W=T).

Also, the loading of the second substrate is timed to be after the completion of the first processing of the first substrate at the first process chamber 6, a timing at which there is no overlap with the convey of the first substrate; specifically, it is set to be (second substrate loading interval=P+2T).

Also, the loading of the third substrate is timed to be after the completion of the final (second) convey process of the second substrate to the second process chamber 7; specifically, it is set to be (third substrate loading interval=3P+5T+W=3P+6T).

Thus, (loading interval of first substrate and third substrate=4P+8T).

Cycle time is (2P+4T).

FIG. 3(B) shows a case in which, in the same substrate processing shown in FIG. 3(A), return processing is implemented two times. That is, in the carrying out of the process processing P1 at the first process chamber 6, process processing P2 at the second process chamber 7, process processing P3 at the third process chamber 8, it shows a case in which the return processing is implemented two times in respect of process processing P2 at second process chamber 7 and process processing P3 at third process chamber 8. In this case, the number n of continuous processes is defined as two, the subject processes being the two process processings P2, P3 that implement return processing.

In this case, with respect to each of first, second, third, . . . , substrates, there are carried out a convey process from a load-lock chamber (first load-lock chamber 4 or second load-lock chamber 10) to the first process chamber 6, process processing P1 at the first process chamber 6, a convey process from the first process chamber 6 to the second process chamber 7, process processing P2 at the second process chamber 7, a convey process from the second process chamber 7 to third process chamber 8, process processing P3 at the third process chamber 8, a convey process from the third process chamber 8 to a preliminary chamber (first preliminary chamber 11 or second preliminary chamber 12), retraction at said preliminary chamber (retraction time W), a convey process from said preliminary chamber to the first process chamber 6, process processing P1 at the first process chamber 6, a convey process from the first process chamber 6 to the second process chamber 7, process processing P2 at the second process chamber 7, a convey process from the second process chamber 7 to the third process chamber 8, process processing P3 at the third process chamber 8, a convey process from the third process chamber 8 to a preliminary chamber (first preliminary chamber 11 or second preliminary chamber 12), retraction at said preliminary chamber (retraction time W), a convey process from said preliminary chamber to the second process chamber 7, process processing P2 at the second process chamber 7, a convey process from the second process chamber 7 to the third process chamber 8, process processing P3 at the third process chamber 8, a convey process from the third process chamber 8 to a load-lock chamber (first load-lock chamber 4 or second load-lock chamber 10). Each convey process is carried out by the vacuum-atmosphere-use transfer machine 13 of the conveyor chamber 5.

Also, the retraction time W of the substrate retracted to the preliminary chambers 11, 12 is set to be a time equal to one convey time T (that is, W=T).

Also, the loading of the second substrate is timed to be after the completion of the first processing of the first substrate at the first process chamber 6, a timing at which there is no overlap with the convey of the first substrate; specifically, it is set to be (second substrate loading interval=P+2T).

Also, the loading of the third substrate is timed to be after the completion of 20 the final (third) convey process of the second substrate to the second process chamber 7; specifically, it is set to be (third substrate loading interval=5P+8T+2W=5P+10T).

Thus, (loading interval of first substrate and third substrate=6P+12T).

Cycle time is (3P+6T).

When m is the number of times return processing is implemented, and k is a natural number, the substrate loading interval is calculated from the following (condition 1), (condition 2).

Also, the cycle time is calculated from the following (condition 3).

(Condition 1) Loading interval of (k·n+1)th substrate= (m·n+1)·(P+2T)

(Condition 2) Loading interval of a substrate other than the above=(P+2T)

(Condition 3) Cycle time=(m+1)·(P+2T)

FIG. 3(C) shows a case in which, in the same substrate processing shown in FIG. 3(A), the time needed for the process processing at each process chamber is different. That is, in the carrying out of the process processing P1 at the first process chamber 6, process processing P2 at the second process chamber 7, process processing P3 at the third process chamber 8, it shows a case in which the return processing is implemented just in respect of process processing P2 at second process chamber 7 and process processing P3 at third process chamber 8, with the process processing times at the process chambers 6, 7, 8 differing. In this case, the number n of continuous processes is defined as two, the subject processes being the two process processings P2, P3 that implement return processing.

In this case, with respect to each of first, second, third, ..., substrates, there are carried out a convey process from a load-lock chamber (first load-lock chamber 4 or second load-lock chamber 10) to the first process chamber 6, process processing P1 at the first process chamber 6, a convey process from the first process chamber 6 to the second process chamber 7, process processing P2 at the second process chamber 7, a convey process from the second process chamber 7 to third process chamber 8, process processing P3 at the third process chamber 8, a convey process from the third process chamber 8 to a preliminary chamber (first preliminary chamber 11 or second preliminary chamber 12), retraction at said preliminary chamber (retraction time W), a convey process from said preliminary chamber to the second process chamber 7, process processing P2 at the second process chamber 7, a convey process from the second process chamber 7 to the third process chamber 8, process processing P3 at the third process chamber 8, a convey process from the third process chamber 8 to a load-lock chamber (first load-lock chamber 4 or second load-lock chamber 10). Each convey process is carried out by the vacuum-atmosphere-use transfer machine 13 of the conveyor chamber 5.

The setting of retraction time W of substrates retracted to the preliminary chambers 11, 12 will now be described.

In this example, the substrate retraction timing W is adjusted as follows, premised on a processing flow where the combination of times required for process processing does not determine the convey rate.

With the processing flow shown in FIG. 3(C), for example, in a case in which the size relationship of the three processing times P1, P2, P3 is (process P1 process time)>(process P2 process time) and also (process P1 process time)>(process P3 process time), the result of summing the reference time $(n-1)T$, the difference between the process times of process P1 and process P2 (expressed as "P1−P2"), and the difference between the process times of process P1 and process P3 (expressed as "P1−P3") is set as the retraction time W ($=(n-1)T+(P1-P2)+(P1-P3)$). In this example, "P1" represents the process processing time by the first process chamber 6 that requires the longest process processing time, and "P2" and "P3" represent the process processing time by the second process chamber 7 and third process chamber 8 that carry out return processing.

Also, with respect to cases in which the number n of continuous processes is changed, similarly to the above, the result of adding to all time differences between the process processing time that requires the longest time to process, and the time required for the processing of other process processing in which return processing is carried out, to the retraction time reference value $(n-1)T$ is set as the retraction time W.

Also, the loading of the second substrate is timed to be after the completion of the first processing of the first substrate at the first process chamber 6, a timing at which there is no overlap with the convey of the first substrate; specifically, it is set to be (second substrate loading interval=P+2T).

Also, the loading of the third substrate is timed to be after the completion of the final (second) convey process of the second substrate to the second process chamber 7; specifically, it is set to be (third substrate loading interval=3P+5T+W).

Thus, (loading interval of first substrate and third substrate=4P+7T+W).

However, as P, there is used, for example, the maximum process processing time; in this example, P1 is used.

Cycle time is $\{(4P+7T+W)/2\}$.

With the substrate processing apparatus of this example described in the above in which a plurality of process chambers 6~9 connected to a conveyor chamber 5 are accommodated in a single substrate convey apparatus (vacuum-atmosphere-use transfer machine 13, in this example), the following substrate processing is carried out in a continuous processing configuration using two or more process chambers P1, P2, ..., Pj (j here being a natural number of two or more) out of the plurality of process chambers 6~9.

That is, in a case in which return processing is implemented in which, from the final process chamber Pj to carry out the continuous processing, the substrate is re-conveyed to any process chamber Px ($1 \leq x < j$) of the continuous-processing process chambers and continuous processing carried out in the order Px, ..., Py ($x \leq y \leq j$), when a substrate is returned from the final process chamber Pj to a process chamber Px, the substrate is conveyed to the process chamber Px after being temporarily retracted to a place other than a process chamber.

Also, with the substrate processing apparatus of this example, when the process times at each of the process chambers P1, P2, ..., Pj are equal, the time of said retraction is defined by $\{(n-1)\cdot T\}$. Here, n is the number of process chambers (number of continuous processes), T is substrate convey time from the ith process chamber Pi to the (i+1)th process chamber Pi+1. In this example, the substrate convey time between load-lock chambers 4, 10 and a process chamber is also T.

Also, with the substrate processing apparatus of this example, in cases where, of the process chambers P1, P2, ..., Pj, the process times of at least two process chambers are different, the retraction time is defined by adding the difference between the maximum substrate process time Pmax among the process chambers P1, P2, ..., Pj and the substrate process times in each of the process chambers in which return processing is implemented to $\{(n-1)\cdot T\}$. Here, n and T are the same as described above.

Also, with the substrate processing apparatus of this example, as one example, when after substrate processing by an arbitrary process chamber A, processing is again carried out by process chamber A after passage through one or more process chambers other than process chamber A in a configuration comprising a conveyor chamber 5 equipped with one transfer machine 13, two or more process chambers 6~9 for heat treatment and ultrathin-film formation, and load-lock chambers 4, 10 for atmosphere replacement of the air-atmosphere of the conveyor chamber 5, a buffer space to which a substrate can be retracted (preliminary chambers 11, 12, in this example) is provided and substrates are conveyed to be temporarily retracted between processings by a process chamber A and a process chamber A.

Also, the processing method carried out by the substrate processing apparatus of this example can be used to provide of method of manufacturing a semiconductor device or a substrate convey control method, for example.

Therefore, in return processing with the substrate processing apparatus of this example, it is possible to keep down degradation in the processing efficiency of the process chambers 6~9, making it possible to improve productivity. Specifically, in the return processing, it is possible to prevent deadlock in the processing flow between earlier and later substrates, making it possible to raise the processing efficiency of the process chambers 6~9 and improve device production capacity.

Moreover, with the substrate processing apparatus of this example, substrate convey means are configured by the function of the vacuum-atmosphere-use transfer machine 13 provided in the conveyor chamber 5, and with return processing controlled by the control section 14, substrate convey control means are configured by functions that temporarily retract substrates to preliminary chambers 11, 12 and carry out other such substrate convey processing.

Below, the background art relating to the present invention is described. The items described here are not necessarily all limited to the background art.

Figure 4:
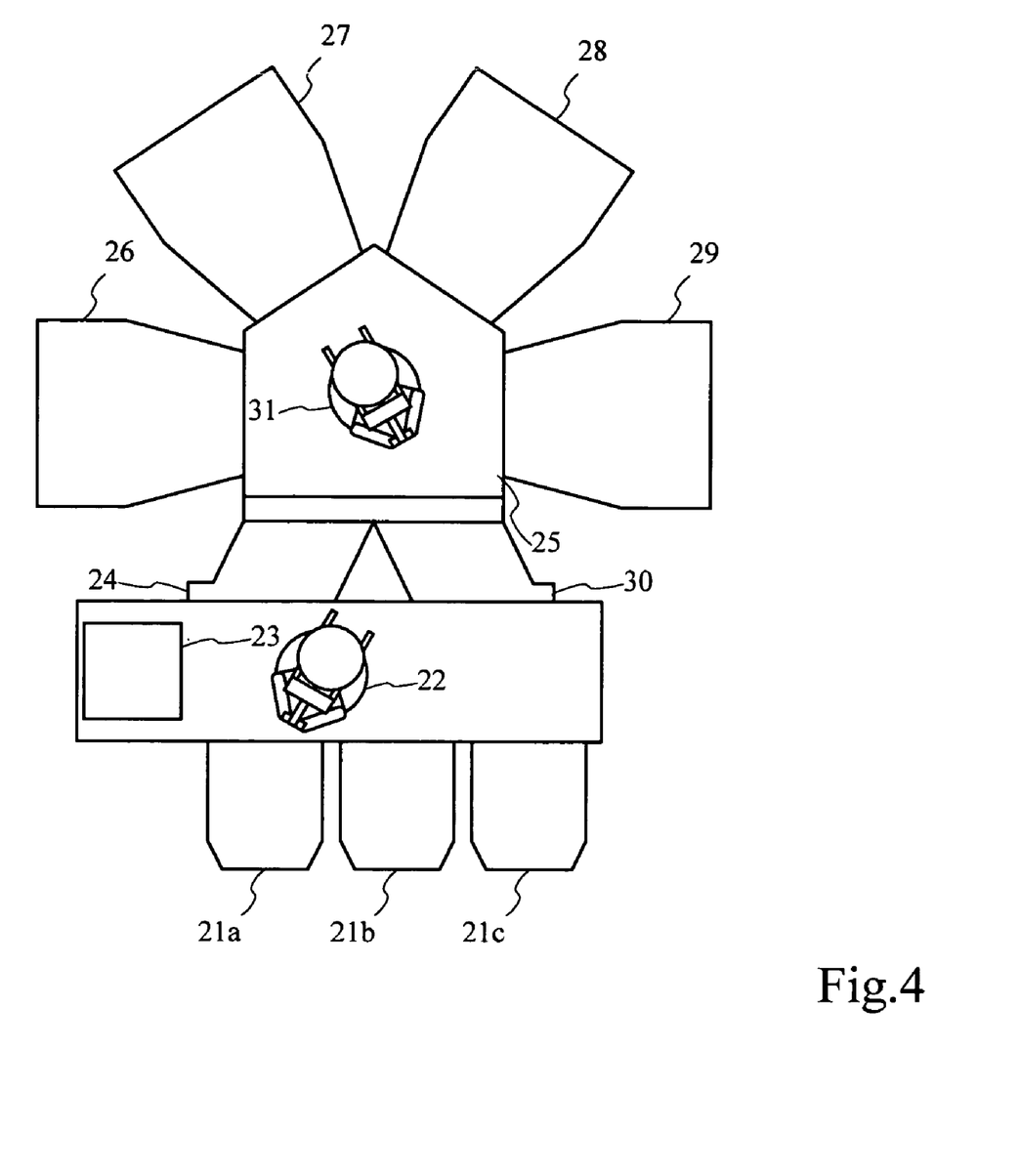
FIG. 4 is a drawing showing an example of a substrate processing apparatus configuration.

FIG. 4 shows an example of a general substrate processing apparatus configuration.

The substrate processing apparatus of this example comprises carrier stations (load ports: LP) 21a, 21b, 21c, a transfer machine (LH) 22 for air-atmosphere use, a substrate alignment unit (aligner: AU) 23, a first load-lock chamber (LM1) 24, a conveyor chamber 25 provided with a transfer machine (TH) 13 for vacuum-atmosphere use, a first process chamber (PM1) 26, a second process chamber (PM2) 27, a third process chamber (PM3) 28, a fourth process chamber (PM4) 29, and a second load-lock chamber (LM2) 30. Broadly speaking, the processing parts 21a~21c, 22~31, have the functions to perform operations similar to those of the corresponding processing parts shown in FIG. 1. Heat treatment process furnaces may be used for the process furnaces (process chambers 26~29); specifically, hot-wall furnaces, lamp furnaces, resistance-heating plate system cold-wall furnaces and the like may be used.

An example of the substrate processing procedure by the substrate processing apparatus shown in FIG. 4 is described, with reference to FIG. 5 and FIG. 6.

FIG. 5 shows an example of the substrate convey flow of one process substrate in a case in which laminated films of ultrathin films are formed via process chambers 26~29, FIG. 6 shows an example of the processing history of the substrate as an event time chart. In FIG. 5 and FIG. 6, there is a mutual correspondence of the processes having the same numbers (1)~(13).

Below, the processes (1)~(13) of the substrate process flow are described, in order.

(1) In the load (air-atmosphere convey) process step, substrates in the carrier station 21a are conveyed one by one to the first load-lock chamber 24 by the transfer machine 22 for air-atmosphere use. In this example, center position alignment and rotational position alignment of the substrate are carried out via the substrate alignment unit 23 to improve repeatability of convey positioning to the first load-lock chamber 24.

(2) In the load-lock chamber evacuation process step, evacuation, N2 atmosphere replacement are carried out to prevent air from entering the conveyor chamber 25. In line with the retained pressure region of the conveyor chamber 25 (1.0E-8~5.0E4 Pa), after evacuation, a supply of inert gas such as N2 is used to adjust the pressure.

(3) In the first substrate convey process step, the vacuum-atmosphere-use transfer machine 31 of the conveyor chamber 25 is used to convey the substrate from the first load-lock chamber 24 to the first process chamber 26.

(4) In the first process processing step, processing is carried out in the first process chamber 26. In addition, the substrate is subjected to film formation processing such as ultrathin film formation, heat treatment and other such processes by the process chambers 26~29.

(5) In the second substrate convey process step, the vacuum-atmosphere-use transfer machine 31 of the conveyor chamber 25 is used to convey the substrate from the first process chamber 26 to the second process chamber 27.

(6) In the second process processing step, processing is carried out in the second process chamber 27.

(7) In the third substrate convey process step, the vacuum-atmosphere-use transfer machine 31 of the conveyor chamber 25 is used to convey the substrate from the second process chamber 27 to the third process chamber 28.

(8) In the third process processing step, processing is carried out in the third process chamber 28.

(9) In the fourth substrate convey process step, the vacuum-atmosphere-use transfer machine 31 of the conveyor chamber 25 is used to convey the substrate from the third process chamber 28 to the fourth process chamber 29.

(10) In the fourth process processing step, processing is carried out in the fourth process chamber 29.

(11) In the fifth substrate convey process step, the vacuum-atmosphere-use transfer machine 31 of the conveyor chamber 25 is used to convey the substrate from the fourth process chamber 29 to the first load-lock chamber 24.

(12) In the load-lock chamber atmospheric pressure return process and substrate cooling process step, atmospheric pressure is restored to return the processed substrate to an air-atmosphere, which simultaneously doubles as a post-processing high-temperature substrate cooling event.

(13) In the unload process step, the processed substrate is conveyed from the first load-lock chamber 24 to the carrier station 21a.

The operations of the above process steps (3), (5), (7), (9), (11) that are described include, for example, the opening of the valve mechanism (gate valve: GV) separating the transfer origin process chamber (here including a load-lock chamber) and the conveyor chamber 25, the convey of a specified substrate to the transfer destination process chamber after it has been held by the vacuum-atmosphere-use transfer machine 31, up to the operation of the closing of the transfer destination GV, and in some cases include the preliminary operation of the vacuum-atmosphere-use transfer machine 31 required to access the transfer origin substrate from the state of completion of the preceding transfer operation. In this example, the time required for this operation is called the convey time.

Also, as the operations of the above process steps (4), (6), (8), (10), there are described, for example, the execution of a specified sequence directly after the closing of the GV in the above transfer operation, for ultrathin film formation on the substrate and heat treatment and the like, up to directly before the opening of the GV to eject the substrate.

In the event time chart shown in FIG. 6, the substrate processing history is arranged as dimensional events in respect of the above steps (1)~(13).

In order to continuously and efficiently perform the same process on a plurality of substrates, an arrangement is required whereby there is no overlapping of the same events in the above time chart.

In the plurality of process chambers 26~29 capable of different processes, as shown in FIG. 5 and FIG. 6, while it is standard procedure to form laminated films in a first process pass of each, there is also a desire for a process for forming laminated films that amount to, or more than, the number of process chambers, using two or more process chambers (return processing). Specifically, with return processing, a substrate that has passed through another process chamber is conveyed to a process chamber in which processing of the substrate has been completed, and is again subjected to the same processing or to processing under different conditions.

Here, in this example, the number of process chambers using return processing event time charts is taken as the number (n) of continuous processes; that is, the number n of continuous processes constitutes the number of process chambers subject to return processing. Also, the substrate processing flow and event time chart described below only pertains to the portion of the vacuum convey system relating to the return processing (for example, the processing portion corresponding to (3)~(11) shown in FIGS. 5 and 6).

Figure 7:
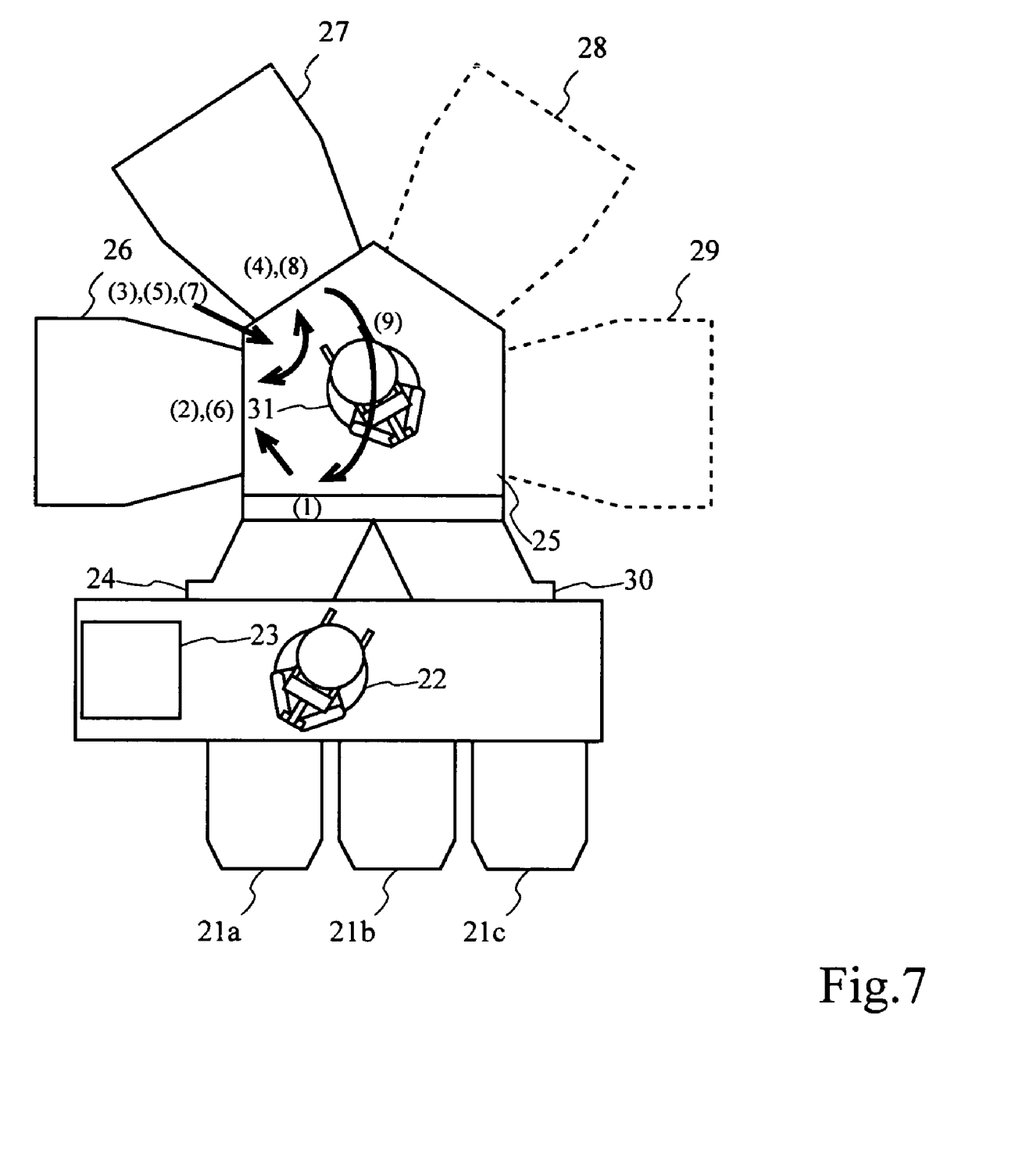
FIG. 7 is a drawing showing an example of a substrate convey flow.

In the example of the flow of substrate processing with return processing constituted by (1)~(9) shown in FIG. 7, the number of continuous processes is two.

(1) In the first substrate convey process step, the substrate is conveyed from the first load-lock chamber 24 to the first process chamber 26 by the vacuum-atmosphere-use transfer machine 31 of the conveyor chamber 25.

(2) In the first process processing step, processing in the first process chamber 26 is carried out.

(3) In the second substrate convey process step, the substrate is conveyed from the first process chamber 26 to the second process chamber 27 by the vacuum-atmosphere-use transfer machine 31 of the conveyor chamber 25.

(4) In the second process processing step, processing in the second process chamber 27 is carried out.

(5) In the third substrate convey process step, the substrate is conveyed from the second process chamber 27 to the first process chamber 26 by the vacuum-atmosphere-use transfer machine 31 of the conveyor chamber 25.

(6) In the third process processing step, processing in the first process chamber 26 is carried out.

(7) In the fourth substrate convey process step, the substrate is conveyed from the first process chamber 26 to the second process chamber 27 by the vacuum-atmosphere-use transfer machine 31 of the conveyor chamber 25.

(8) In the fourth process processing step, processing in the second process chamber 27 is carried out.

(9) In the fifth substrate convey process step, the substrate is conveyed from the second process chamber 27 to the first load-lock chamber 24 by the vacuum-atmosphere-use transfer machine 31 of the conveyor chamber 25.

FIGS. 8(A), (B), (C) show examples, in substrate processing with return processing, of event time charts in the case of the processing of a plurality of substrates.

In this example, the process time of each of the process chambers 26~29 is the same time P, and the convey time for one pass by the vacuum-atmosphere-use transfer machine 31 is T.

Also, in this example, the processing time per substrate in a case in which a plurality of substrates will continue to be processed semipermanently is defined as the cycle time (that is, the cycle time=loading interval).

FIG. 8(A) shows a case in which the number of continuous processes is two.

In this case, the processing shown in FIG. 7 is carried out in respect of each of the first, second, third, . . . substrates.

Also, the loading of the second substrate is timed to be after the completion of the first processing of the first substrate by the first process chamber 26, a timing at which there is no overlap with the convey of the first substrate. This also applies with reference to the loading timing of the third and subsequent substrates.

In this case, the standby time (interval) of the first process chamber 26 becomes equal to the process time P of the second process chamber 27, and this is also the case with respect to the standby time (interval) of the second process chamber 27.

Also, when the number of continuous processes is two, the cycle time CT1 is expressed by (CT1=3P+4T).

FIG. 8(B) shows a case in which the number of continuous processes is three.

In this case, processing by three process chambers (first process chamber 26, second process chamber 27, third process chamber 28, in this example) is repeated in respect of each of the first, second, third, . . . substrates.

Also, the loading of the second substrate is timed to be after the completion of the first processing of the first substrate by the first process chamber 26, a timing at which there is no overlap with the convey of the first substrate. This also applies with reference to the loading timing of the third and subsequent substrates.

In this case, the standby time (interval) of the first process chamber 26 becomes equal to the sum of the process time P of the second process chamber 27, the process time P of the third process chamber 28, and one convey time T (2P+T); this is also the case with respect to the standby times (intervals) of the second process chamber 27 and the third process chamber 28.

Also, when the number of continuous processes is three, the cycle time CT2 is expressed by (CT2=4P+5T).

FIG. 8(C) shows a case in which the number of continuous processes is four.

In this case, processing by four process chambers (first process chamber 26, second process chamber 27, third process chamber 28, fourth process chamber 29, in this example) is repeated in respect of each of the first, second, third, . . . substrates.

Also, the loading of the second substrate is timed to be after the completion of the first processing of the first substrate by the first process chamber 26, a timing at which there is no overlap with the convey of the first substrate. This also applies with reference to the loading timing of the third and subsequent substrates.

In this case, the standby time (interval) of the first process chamber 26 becomes equal to the sum of the process time P of the second process chamber 27, the process time P of the third process chamber 28, the process time P of the fourth process chamber 29 and two convey times T (3P+2T); this is also the case with respect to the standby times (intervals) of the second process chamber 27, the third process chamber 28 and fourth process chamber 29.

Also, when the number of continuous processes is four, the cycle time CT3 is expressed by (CT3=5P+6T).

Here, in the method shown in FIGS. 8(A), (B), (C), cycle time tends to increase with the increase in the number n of continuous processes (for example, CT1<CT2<CT3).

With the method shown in FIGS. 8(A), (B), (C), also, implementation of return processing produces large standby times (intervals) in which there is no substrate processing or conveyance in the process chambers 26~29, drastically reducing the working efficiency of the process chambers 26~29.

In return processing, attention has to be paid to preventing substrate convey deadlock when a plurality of substrates are being processed. Deadlock is a state in which conveyance becomes impossible, for example, when return processing is being carried out using, as an example, two process chambers 26, 27, when the first substrate is conveyed to the second process chamber 27 via the first process chamber 26, and the second substrate is conveyed to the first process chamber 26 during processing of the first substrate by the second process chamber 27. That is, while the first substrate is at the second process chamber 27 and the next transfer destination is the first process chamber 26, because the second substrate is at first process chamber 26 and the next transfer destination is the second process chamber 27, the mutual presence of both substrates makes it impossible for each to ensure its own convey route.

As shown in FIGS. 8(A), (B), (C), an effective method of securely preventing deadlock in return processing is, for example, when the first processing of a substrate is to be carried out at the first process chamber 26, to adjust the timing (for example, the loading interval) at which each substrate is loaded so that when a substrate is to be conveyed to the first process chamber 26, a later substrate convey is started after the completion of the final processing of the preceding substrate processing at the first process chamber 26.

In the method shown in FIGS. 8(A), (B), (C), if n is the number of continuous processes and T is the convey time between process chambers, and the process time of each process chamber is a uniform time P, cycle time CT is expressed by $\{CT=(n+1)\cdot P+(n+2)\cdot T\}$.

The above is described with respect to a case in which return processing is carried out just once, in which case, when the return processing is implemented one time, the number of processing passes by the same process chamber is two.

Furthermore, the cycle time CTm in a case in which the number of return processings is m is expressed by $\{CTm=(m\cdot n+1)\cdot P+(m\cdot n+2)\cdot T\}$.

As shown by these equations, the length of the cycle time increases in proportion to the number n of continuous processes and the number m of return processing passes, and also, as shown in FIGS. 8(A), (B), (C), there is a high dependency of standby times (intervals) which do not contribute to either process processing by the process chambers or to convey processes. As such, with the method of this example, there has been the problem of a drastic reduction in the processing efficiency of the process chambers, resulting in a drop in semiconductor substrate production efficiency.

In response to this, the present invention enables substrate processing with return processing to be carried out efficiently.

The configurations of the substrate processing apparatus of the present invention are not necessarily limited to those described in the foregoing, with various configurations being usable. Also, the present invention can be provided as, for example, methods or systems that execute processing in accordance with the present invention, and programs to realize such methods or systems, and recording media that records said programs, and can also be provided as various apparatuses or systems.

Also, the field of application of the present invention is not necessarily limited to that described in the foregoing, the present invention being applicable to various fields.

Also, the various types of processing performed in the substrate processing apparatus and so forth of the present invention may be constituted by being implemented in hardware resources equipped with a processor and memory and the like, for example, being controlled by means of a processor executing a control program stored in ROM (Read Only Memory), and the various functional means for executing this processing may also be constituted as independent hardware circuits.

Also, the present invention may also be understood as one wherein the above control program (itself) is stored on a Floppy® disc, CD (Compact Disc)-ROM or other computer-readable recording medium, so that the processing according to the present invention can be implemented by said control program being input from the recording medium into a computer and executed by a processor.

INDUSTRIAL APPLICABILITY

As described in the foregoing, in accordance with the substrate processing apparatus and the like according to this invention, in a case in which after a substrate is continuously processed by two or more process chambers, the substrate is re-conveyed from the last process chamber to any of the two or more process chambers other than the last and return processing implemented, in the re-conveyance the substrate is conveyed to said any of the process chambers after being temporarily retracted to a place other than a process chamber, so that when a plurality of substrates are being continuously processed, substrate processing with return processing can be efficiently carried out.

The invention claimed is:

1. A substrate processing apparatus that continuously processes a plurality of substrates, the substrate processing apparatus comprising:

a conveyor chamber constituting a substrate convey space;

a plurality of process chambers that carry out substrate processing, said process chambers being disposed so as to adjoin a periphery of said conveyor chamber, wherein said conveyor chamber is centrally disposed relative to said process chambers;

a substrate convey apparatus provided in said conveyor chamber having a function of conveying substrates; and a control section that controls convey processing of substrates by the substrate convey apparatus so that, in a case in which after a substrate is continuously processed by two or more process chambers, the substrate is re-conveyed from the last process chamber to any of the two or more process chambers other than the last and return processing is implemented, and in the re-conveyance the substrate is conveyed to said any of the process chambers after being temporarily retracted to a place other than a process chamber, wherein the place to which the substrate is retracted is adapted to accommodate a number of substrates, with the number of substrates being equal to the number of substrates that can be processed at one time by all of said process chambers, and wherein, in a case in which the substrate process time in each of said two or more process chambers is equal, taking n as the number of process chambers subject to return processing and T as substrate convey time between processing chambers, the retraction time used by the control section is $\{(n-1)\cdot T\}$.

2. In the substrate processing apparatus as described in claim 1, wherein processing at each process chamber in the return processing is the same processing as processing carried out a preceding time in each of the process chambers.

3. In the substrate processing apparatus as described in claim 1, wherein processing at each process chamber in the return processing is processing under different conditions from processing carried out a preceding time in each of the process chambers.

4. In the substrate processing apparatus as described in claim 1, wherein, with respect to a single substrate, by carrying out a number of processings that is the same as, or greater than, the number of process chambers connected to the conveyor chamber.

5. In the substrate processing apparatus as described in claim 4, wherein, on the single substrate are formed a number of laminated films that is the same as, or greater than, the number of said process chambers.

6. In the substrate processing apparatus as described in claim 1, wherein the control section controls convey processing of substrates by the substrate convey apparatus so that a second substrate is conveyed to a first process chamber alter processing of a first substrate at the first process chamber and conveyance of the first substrate to a next process chamber has been completed.

7. In the substrate processing apparatus as described in claim 1,
wherein the place other than a process chamber to which the substrate is retracted is in a preliminary chamber connected to the conveyor chamber.

8. In the substrate processing apparatus as described in claim 1,
wherein the place other than a process chamber to which the substrate is refracted is in a load-lock chamber connected to the conveyor chamber.

9. In the substrate processing apparatus as described in claim 1,
wherein substrate process time in the process chambers is defined as the time from the closing of a gate valve separating the process chambers and the conveyor chamber to the opening of the gate valve after processing of the substrate has been carried out.

10. In the substrate processing apparatus as described in claim 1,
wherein the convey time is defined as the time from the opening of a gate valve separating the transfer origin process chamber and the conveyor chamber to the convey of the substrate subject to convey to the transfer destination process chamber after it has been held by the substrate convey apparatus, and the closing of the transfer destination gate valve.

11. In a substrate processing apparatus in which a plurality of process chambers are connected to a periphery of a centrally disposed conveyor chamber, said process chambers being accommodated in a single substrate convey apparatus and continuous substrate processing is carried out in two or more process chambers P1, P2, ..., Pj (j here being a natural number of two or more) of said plurality of process chambers,
a substrate processing apparatus equipped with a control section that controls substrate convey processing by the substrate convey apparatus so that in a case in which return processing is implemented in which, from the final process chamber Pj to carry out the continuous processing, the substrate is re-conveyed to any process chamber Px ($1 \leq x < j$) of the continuous-processing process chambers and continuous processing carried out in the order Px, ..., Py ($x \leq y \leq j$), when a substrate is returned from the final process chamber Pj to a process chamber Px, the substrate is conveyed to the process chamber Px after being temporarily refracted to a place other than a process chamber,
wherein the place to which the substrate is retracted is adapted to accommodate a number of substrates, with the number of substrates being equal to the number of substrates that can be processed at one time by all of said process chambers, and
wherein, in a case in which the substrate process time in each of said two or more process chambers is equal, taking n as the number of process chambers subject to return processing and T as substrate convey tune between processing chambers, the refraction time used by the control section is $\{(n-1) \cdot T\}$.

12. A semiconductor device manufacturing method for manufacturing semiconductor devices by continuous processing of a plurality of substrates, the method comprising:
processing a substrate continuously in a plurality of processing chambers that are adjoined to a periphery of a conveyor chamber, wherein the conveyor chamber is centrally disposed with respect to the processing chambers;
re-conveying the substrate after the substrate has been continuously processed by two or more of the processing chambers, wherein the substrate is re-conveyed from the last processing chamber to any of the two or more processing chambers other than the last processing chamber, and thereby implementing return processing of the substrate; and
temporarily retracting the substrate to a place other than a processing chamber during re-conveyance of the substrate, wherein the place to which the substrate is retracted is adapted to accommodate a number of substrates, with the number of substrates being equal to the number of substrates that can be processed at one time by all of said processing chambers, and
wherein, in a case in which the substrate process time in each of said two or more processing chambers is equal, taking n as the number of processing chambers subject to return processing and T as the substrate convey time between processing chambers, the retraction time used by the control section is $\{(n-1) \cdot T\}$.

* * * * *